United States Patent
Scheck (12) 
(10) Patent No.: US 7,376,170 B2
(45) Date of Patent: May 20, 2008

(54) DIGITAL IMBALANCE CORRECTION METHOD AND DEVICE IN A RECEIVER FOR MULTI-CARRIER APPLICATIONS

(75) Inventor: Hans-Otto Scheck, Espoo (FI)

(73) Assignee: Nokia Corporation, Espoo (FI)

( * ) Notice: Subject to any disclaimer, the term of this patent is extended or adjusted under 35 U.S.C. 154(b) by 689 days.

(21) Appl. No.: 10/629,914

(22) Filed: Jul. 30, 2003

(65) Prior Publication Data

US 2004/0082300 A1 Apr. 29, 2004

(30) Foreign Application Priority Data

Aug. 2, 2002 (WO) .................. PCT/IB02/03007

(51) Int. Cl.
*H04B 1/69* (2006.01)
*H04B 1/66* (2006.01)

(52) U.S. Cl. ....................... 375/130; 375/340

(58) Field of Classification Search ................ 375/340, 375/345, 343, 317, 329, 350, 130; 370/210; 455/232.1, 136

See application file for complete search history.

(56) References Cited

U.S. PATENT DOCUMENTS

| | | | |
|---|---|---|---|
| 6,044,112 A | 3/2000 | Koslov | |
| 6,075,980 A | 6/2000 | Scheck | |
| 6,137,999 A | 10/2000 | Lovelace et al. | |
| 6,151,356 A * | 11/2000 | Spagnoletti et al. | 375/226 |
| 6,377,620 B1 * | 4/2002 | Ozluturk et al. | 375/235 |
| 7,116,733 B2 * | 10/2006 | Yamanaka et al. | 375/345 |

| | | | |
|---|---|---|---|
| 2001/0036221 A1 * | 11/2001 | Sato | 375/147 |
| 2002/0097812 A1 | 7/2002 | Wiss | |

(Continued)

FOREIGN PATENT DOCUMENTS

EP 0 305 603 A1 3/1989

(Continued)

OTHER PUBLICATIONS

Behbahani, et al.; "A Broad-Band Tunable CMOS Channel-Select Filter For A Low-IF Wireless Receiver", IEEE Journal of Solid-State Circuits, vol. 35, No. 4, Apr. 2000, pp. 476-489.

(Continued)

*Primary Examiner*—Khai Tran
(74) *Attorney, Agent, or Firm*—Squire, Sanders & Dempsey LLP (57) ABSTRACT

A digital imbalance correction device and method are provided including an input unit to receive first input signals. A time-to-frequency-domain-transformer performs a transformation of the first input signals from time-domain into frequency-domain. A subtractor receives second input signals and outputs a gain difference as a function of frequency at its output. A cross-correlator receives third input signals based on the input signals, and outputs a cross-correlation of the third input signals. A gain corrector receives a fourth input signal based the associated first input signal. A gain of the fourth input signal is corrected based on the power difference spectrum. A phase corrector receives a fifth input signal based the associated first input signal. A phase of the fifth input signal is corrected based on the cross-correlation output, such that the phase of the fifth input signal is in quadrature relation to the other one of the first input signals.

28 Claims, 9 Drawing Sheets

U.S. PATENT DOCUMENTS

2005/0063487 A1* 3/2005 Sayegh ............... 375/316
2006/0019624 A1* 1/2006 Suominen ............ 455/200.1
2006/0133459 A1* 6/2006 Boulanger et al. ..... 375/148

FOREIGN PATENT DOCUMENTS

| EP | 0 875 988 A2 | 11/1998 |
|---|---|---|
| EP | 0 875 988 A3 | 11/1998 |
| EP | 0 875 988 B1 | 5/2004 |
| WO | WO 02/056523 | 7/2002 |

OTHER PUBLICATIONS

Coersmeier, et al.; "*High Precision Analog Front-End Transceiver Architecture for Wireless Local Area Network*", 6th International OFDM-Workshop (InOWo) 2001, Hamburg, pp. 29-1-29-4.

Crols, et al.; "*A Single-Ship 900 MHz CMOS Receiver Front-End With A High Performance Low-IF Topology*", IEEE Journal of Solid-State Circuits, vol. 30, No. 12, Dec. 1995, pp. 1483-1492.

Valkama, et al.; "*Advanced DSP for I/Q Imbalance Compensation in a Low-IF Receiver*", Telecommunications Laboratory, Tampere, Finland, pp. 1-5.

Valkama, et al.; "*Advanced I/Q Signal Processing for Wideband Receivers: Models and Algorithms*", Tampere University of Technology Publications, pp. 1-73.

Valkama, et al.; "*On the Performance of Interference Canceller Based I/Q Imbalance Compensation*", pp. 1-5.

\* cited by examiner

DIGITAL IMBALANCE CORRECTION METHOD AND DEVICE IN A RECEIVER FOR MULTI-CARRIER APPLICATIONS

BACKGROUND OF THE INVENTION

1. Field of the Invention

The present invention relates to a digital imbalance correction method and device. In particular, the present invention relates to such a device adapted for use in a receiver designed for multi-carrier applications.

2. Description of the Related Art

With the recent progress in telecommunications, receivers tend to be designed for so-called multi-carrier applications in order to be able to receive signals composed of multiple carriers, each carrier originating from a different transmitter. For example, such applications are likely to occur in connection with e.g. frequency diversity scenarios.

This invention relates to such broadband dual (or multi-) branch receivers for such multi-carrier applications. A broadband dual (or multi-) branch converter is used to convert the complete RF band (Radio Frequency) of interest including multiple channels/carriers to a low pass limited frequency band. This low-pass limited spectrum will be converted into digital data by low-pass ADCs (Analog-to-Digital Converters) after the analog branches.

Precisely, this represents a low IF receiver (Intermediate Frequency), as each independent channel is still on an IF frequency. The term "Direct Conversion" is applied here to emphasize that a complete RF band is converted to the baseband by means of an I/Q (or multi-branch) converter, lowpass sampled and converted to a digital signal. This digital signal typically contains several independent channels, which are then separated by digital filters. Alternatively, it contains one broadband channel such as an OFDM (Orthogonal Frequency Division Multiplexing) or an arbitrary signal.

Figure 1:
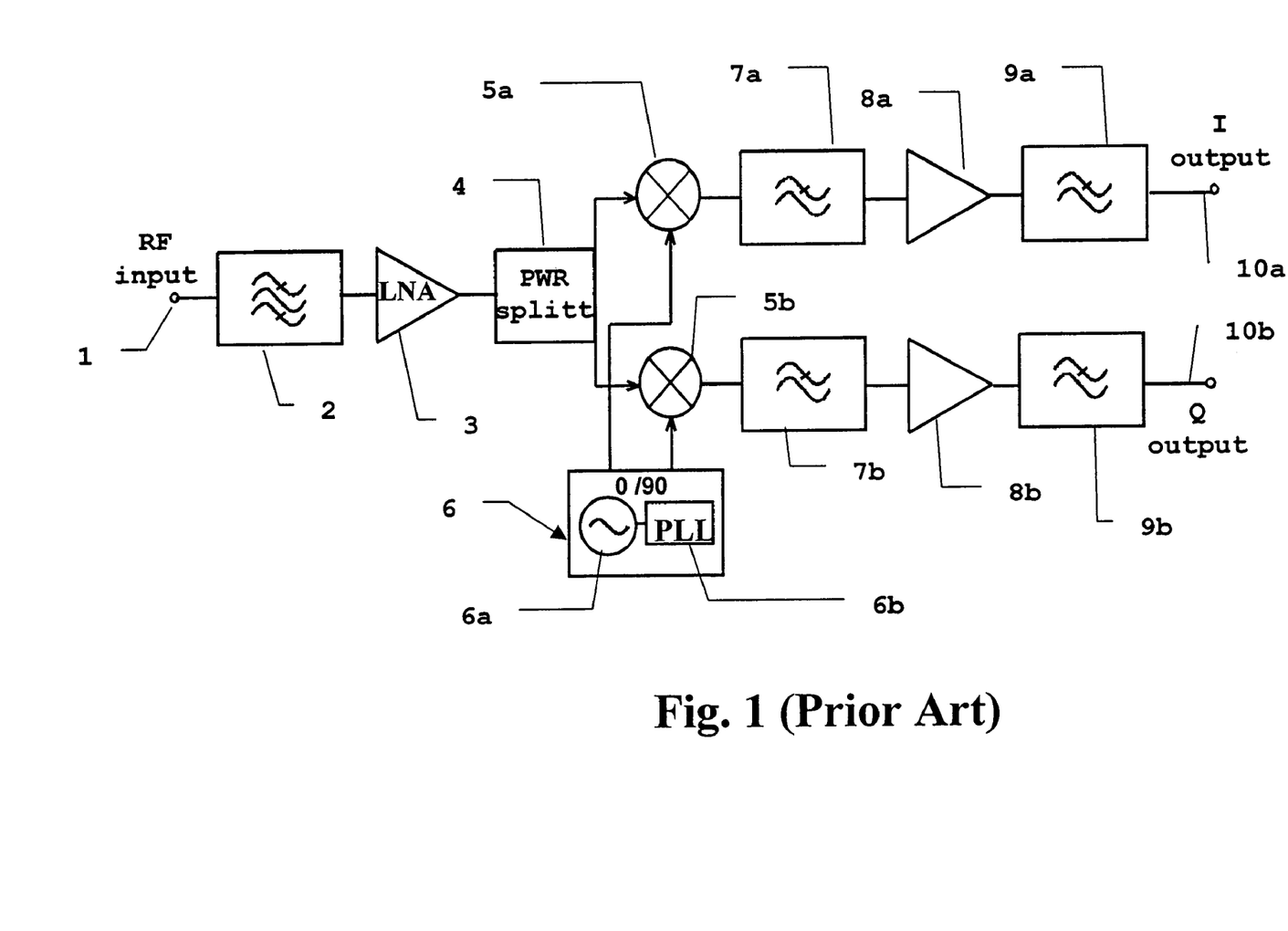
FIG. 1 shows a basic analog part of an I/Q conversion receiver.

FIG. 1 shows a basic analog part of an I/Q conversion receiver. An input RF signal is supplied to an input terminal 1. The input RF signal contains one or more individual channels (multi-carrier signal) and may originate from several independent transmitters. Multi-branch receiver (RX) means that there is one antenna and in principle only one receiver, but the receiver has several parallel branches to process the signal from one antenna. That is typically the direct conversion receiver. In a superhet receiver, the image frequency is suppressed by a filter. In the Direct Conversion receivers, the image is too close to be filtered. The two branches allow to separate the images, although the contents in each branch is corrupted. Adding a third or more branches with different phases would allow to correct for hardware errors (like DC offset). In short, diversity copes with path distortion, multi-branch copes with hardware distortion.

Herein below, "branch" is used for denoting a hardware branch and/or signal path, whereas "component" (such as I and Q component) is used to denote a mathematical descriptive model of a signal. Stated in other words, a signal can be mathematically described by its components (I and Q components), the two components may be processed digitally: if processed in serial, one hardware branch is needed therefor, while if processed in parallel, two (or more) hardware branches are required. Thus, the analog RF front-end shown in FIG. 1 has two independent branches (or path for a signal component), one for the Q- and one for the I-component.

A bandpass filter BPF 2 following the RF input terminal 1 selects a certain frequency band. The thus selected frequency band is amplified using a low noise amplifier LNA 3, and supplied to a power splitter 4 which splits the signal in two branches. Each respective branch of the split signal is supplied to a respective mixer 5a, 5b, respectively. At the respective mixer 5a, 5b, the split signal component (carried in the concerned branch) is subjected to a mixing using a respective signal supplied from a local oscillator 6. The local oscillator 6 generates two oscillating output signals mutually shifted by 90° such as a sine and a cosine signal, using a phase locked loop PLL 6b and a oscillator element 6a. The mixed signals are respectively subjected to a subsequent low pass filtering using low pass filters LPF 7a, 7b, amplified by amplifiers 8a, 8b, respectively, and finally output by a respective intermediate low pass filter LPF 9a, 9b. These outputs are designated as an I output 10a and a Q output 10b, respectively. The I output 10a represents the in-phase component of the signal, whereas the Q output represents the quadrature component of the signal.

The low pass filters 7a, 7b, respectively, downstream the mixers 5a, 5b select a wanted channel (or wanted channels, depending on the width of the passband of the filters) within the band remaining after the filtering by BPF 2. The dual branch or I/Q receiver as in FIG. 1 is known per se, and an example for TV applications is disclosed in the U.S. Pat. No. 4,633,315.

One of the key impairments of this architecture resides in an amplitude (gain) and phase imbalance of the two (or multiple) signal branches in the receiver. In a single carrier receiver (RX) this I/Q-imbalance reduces the signal-to-noise ratio S/N of the receiver and causes performance degradation.

Efforts are therefore made in order to correct for such an I/Q imbalance. Gain and phase correction in a dual branch receiver is for example disclosed in the European patent EP-A-0 305 603 and the U.S. Pat. No. 6,044,112. These prior art patents, however, are related to true direct conversion receivers for single carrier applications.

In the case of multi-carrier reception, however, amplitude and phase imbalance of the two branches (i.e. I and Q branch) cause interference of the channels located at equal frequency differences above and below the frequency of the local oscillator 6. Phase and amplitude differences of the I- and Q- branches limit the practical image rejection to some 30 dB, while for a GSM multi-carrier application more than 65 up to 95 dB of image rejection is required. Note that image rejection is achieved by summing the I/Q-signals with proper phase and amplitude. The achievable image rejection can be directly calculated from amplitude and phase mismatch (imbalance) of the two branches (I,Q), which in turn are directly related to component tolerances.

In prior art, in order to deal with problems in connection with multi-radio/multi-channel arrangements, there are basically two solutions:

A single conversion to a high IF and IF sub-sampling. Currently available analog-to-digital converters (ADCs) are, however, not sufficient and immense effort is spent by various manufactures to overcome this problem.

A double conversion to a low IF and low-pass sampling. This, however, requires enormous linearity of the RF stages. This solution is on the very edge of being feasible with currently available technology. Although it seems to be feasible, it is associated with rather high implementation costs. Furthermore, the double IF solution is prone to spurious responses and requires different IF frequencies for different RF bands.

Furthermore, I/Q-error correction is being investigated, and multiple methods have been published on I/Q-error correction. However, these papers concentrate on correction algorithms for single channel or OFDM applications, where the band of interest comes from one single signal source. Multi-carrier applications, however, where each carrier originates from a different transmitter (TX) have to handle a considerable higher dynamic range. In a dissertation by Mikko Valkama, Tampere University of Technology, 2001, it is discussed that the task of improving the image signal attenuation of the basic quadrature down-conversion scheme, either using analog or digital techniques, has been addressed to some extent in recent literature, where several different ideas are discussed. Commonly, in the digital methods, the approach is to estimate the effective mismatches between the I and Q branch amplitudes and phases. Then, employing these estimates, some kind of a correction network is used to restore the ideal matching conditions (equal amplitudes and a phase difference of 90°). However, most of these methods share the problem of being unable to compensate for amplitude and phase mismatches which depend on frequency and/or time. Furthermore, most of the proposed estimation techniques are based on known test or calibration signals, thereby complicating their use during the normal receiver operation.

Consequently, the drawbacks of the known methods are one or a combination of the following:
Not able to compensate frequency dependent mismatches
Not able to compensate time dependent mismatches
Need for test or calibration signals.

Even though M. Valkama mentions in his thesis and further publications "Statistical Signal Processing Techniques for
Imbalance Compensation", these are based on using certain assumptions on the wanted and interfering signals, in order to be able to compensate the amplitude and phase mismatches without needing test signals and also compensating for frequency and time dependencies. However, in order to function properly, the assumed frequency dependency model has to be correct. Otherwise, the desired result can not be obtained. However, the estimation of time dependency is also a problem in case of fast varying signals, such as in the GSM system.

In summary, direct conversion of a multi-carrier signal, however, is currently not feasible for cellular applications.

SUMMARY OF THE INVENTION

Consequently, it is an object of the present invention to provide an improved method and device for digital imbalance correction which enables the realization of direct conversion for multi-carrier signals.

According to the present invention, the above object is for example achieved by a digital imbalance correction device, comprising
input means adapted to receive first input signals containing a plurality of channels from an I/Q converter stage at respective input terminals, each input terminal being associated to a respective signal branch,
a time-to-frequency-domain-transforming means adapted to perform a transformation of said first input signals from time-domain into frequency-domain, the transformation result being represented as a power spectrum of said respective first input signals,
a subtracting means arranged to receive at its inputs second input signals which are represented by the power spectra of said respective transformed first input signals and to output the gain difference as a function of frequency at its output,
a cross-correlation means arranged to receive at its inputs third input signals based on said first input signals, and to output a cross-correlation of said third input signals, said cross-correlation output being proportional to a phase error between said respective third input signals,
a gain correction means arranged in one of said respective signal branches and receiving at its input a fourth input signal based on said associated first input signal, wherein a gain of said fourth input signal is corrected based on said power difference spectrum such that said gain of said fourth input signal equals the gain of the other one of said first input signals, and
a phase correction means arranged in one of said respective signal branches and receiving at its input a fifth input signal based said associated first input signal, wherein a phase of said fifth input signal is corrected based on said cross-correlation output, such that said phase of said fifth input signal is in quadrature relation to the other one of said first input signals.

"Quadrature relation" here means that the signals (I and Q components) are to a degree which is defined by configuration of the device in quadrature to each other. In a preferred and perfect case this means exactly 90° phase shift. However, in practical implementations, the quadrature relation obtained by correction may deviate from the perfect case. The degree of deviation that may still be acceptable and that may be reached depends on the resolution of e.g. delay elements used in phase correction and/or of the resolution of detection of phase imbalance. (Note that typical RF I/Q-converters exhibit phase errors of around 2-5 degrees.) The required and/or desired accuracy for the mult-carrier application is in the order of about 0.01 degrees, which is considered to be close to "perfect" quadrature. Thus, quadrature relation here means that the phase imbalance is in the order of about 0.01 degrees or less.

According to favorable further developments
said input means further comprise analog-to-digital converter means adapted to covert analog input data to digital data,
a channelizer means is provided, arranged to receive at its respective inputs the phase-corrected and gain-corrected signals based on said first input signals associated to said respective signal branches and adapted to demodulate said signals into the respective individual channels,
said phase correction means comprises controllable delay elements,
said gain correction means comprises controllable amplifier elements,
in one of said signal branches said first input signal equals the third input signal, while in the other of said signal branches said first input signal equals the fourth input signal, the third input signal equals the fifth input signal, with the third and the fifth input signals being equal to the gain-corrected fourth input signal,
in one of said signal branches said first input signal equals the third input signal, while in the other of said signal branches said first input signal equals the third and the fourth input signal, and the fifth input signal equals the gain-corrected fourth input signal,
in one of said signal branches said first input signal equals the third input signal, while in the other of said signal branches said first input signal equals the third and the fifth input signal, and the fourth input signal equals the phase-corrected fifth input signal, said gain correction means and said phase correction means are arranged in the same respective signal branches, said gain correction means and said phase correction means are arranged in respective different ones of said signal branches.

Also, the above object is for example achieved by a method for digital imbalance correction method comprising the steps of inputting first input signals I-in, Q-in containing a plurality of channels and resulting from an I/Q conversion, time-to-frequency-domain-transforming said inputted first signals to perform a transformation of said first input signals from time-domain into frequency-domain, the transformation result being represented as a power spectrum of said respective first input signals, subtracting the power spectra of said respective transformed first input signals and outputting the gain difference as a function of frequency, performing a cross-correlation based on said input signals, and outputting said cross-correlation which is proportional to a phase error between said respective correlation input signals, performing a gain correction for said input signals based on said power difference spectrum such that said gain of said input signals equals each other, and performing a phase correction for said input signals based on said cross-correlation such that said phase of said input signals is in quadrature relation to each other.

According to advantageous further developments of the method said phase correction step comprises controlling a delay,
said gain correction step comprises controlling an amplification,
said inputting step further comprise analog-to-digital conversion to covert analog input data to digital data, and
the method further comprises a channelization step which processes the phase-corrected and gain-corrected signals based on said first input signals and demodulates said signals into the respective individual channels.

By virtue of the present invention, basically the following advantages can be achieved:

The invention reduces

The ADC requirements compared to the previously known solution of single IF conversion mentioned above dramatically, making available ADCs sufficient for multi-carrier applications The complexity and cost of both above mentioned solutions drastically, and is furthermore considerably more flexible for various RF band adaptations (multi-band radio).

Thus, the present invention provides a way to estimate and/or calculate phase and amplitude errors and/or imbalance of an analogue IQ-demodulator in a receiver using digital processing. This enables the use of direct conversion architectures in multi-carrier receivers. The use of the received antenna signal as such enables to estimate the imbalance in the modulator, without needing a special test signal.

There seem to be no other applicable methods for estimating IQ imbalance in analog IQ modulators for multi-carrier receivers. If IQ balance can be estimated and compensated properly, it enables a direct conversion architecture in which the received signals are converted to the digital domain at baseband frequencies. This results into minimum complexity of the receiver and the easiest requirements for the A-to-D converters. The direct conversion architecture also avoids the very tedious frequency planning process in the receiver, because no intermediate frequencies are needed.

Without imbalance correction, multi-carrier receivers are forced to analog-to-digital conversion of an intermediate frequency signal. This imposes extremely demanding requirements on the converters and their clocks. Also finding suitable intermediate frequencies in a single- or dual-conversion multi-carrier receiver is not easy. For a multi-band and multi-carrier receiver, finding common intermediate frequencies for all bands may even be impossible. Advantageously, all these problems can be avoided by the present invention.

BRIEF DESCRIPTION OF THE DRAWINGS

In the following, the present invention will be described in greater detail with reference to the accompanying drawings, in which.

DETAILED DESCRIPTION OF THE EMBODIMENTS

The present invention will subsequently be described in detail with reference to the accompanying drawings.

Figure 2:
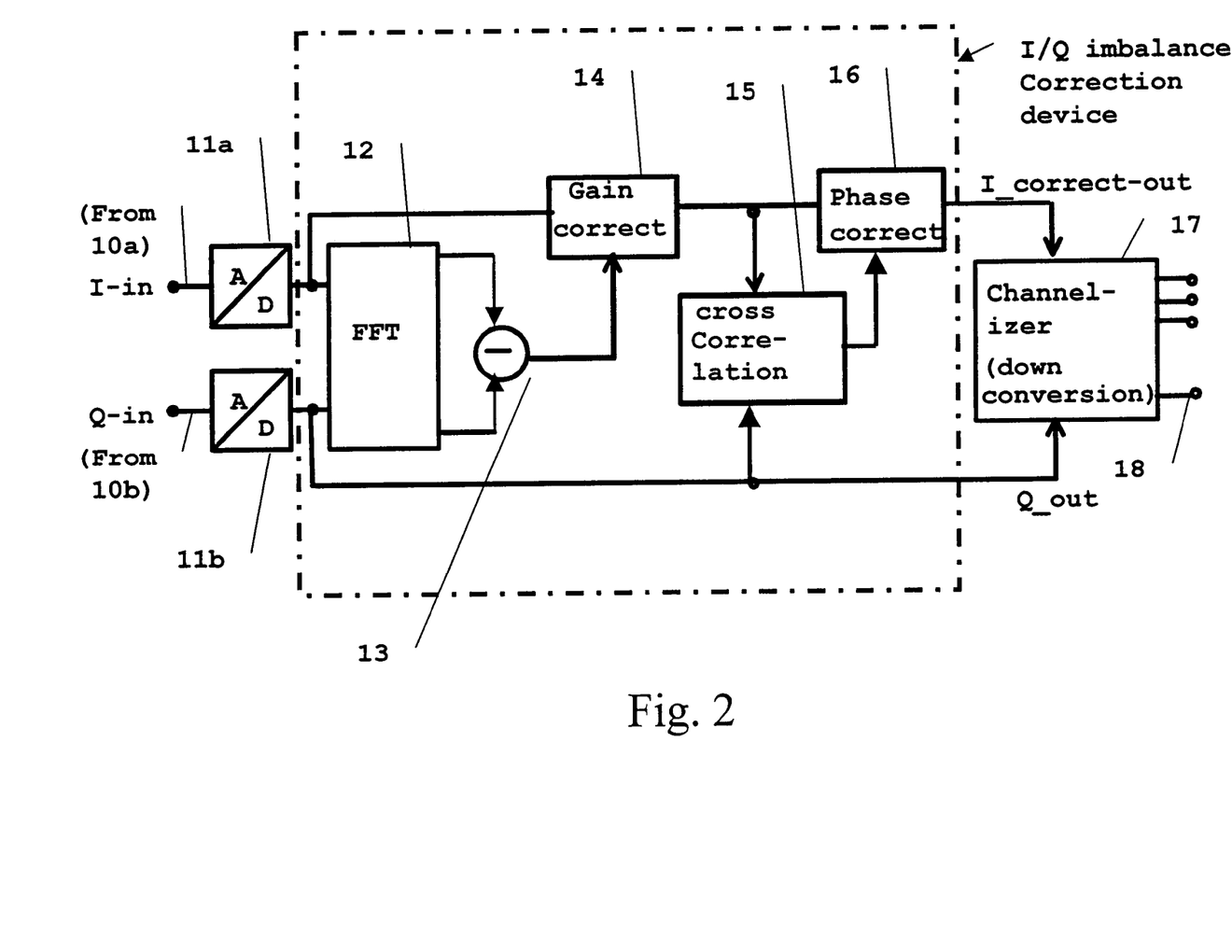
FIG. 2 shows an embodiment of the digital imbalance correction device according to the present invention.

FIG. 2 shows an embodiment of the digital error correction device according to the present invention. The error correction device may be used as a subsequent stage following the analog part of an I/Q conversion receiver as for example shown in FIG. 1. Nevertheless, it may be used as a subsequent stage for imbalance/error correction following also other kinds of multi-branch receivers as long as they output signal components converted with oscillator signals of multiple phases. For example, the imbalance (error) correction device may also be connected to the output of a double quadrature receiver or tri-phase receiver. Firstly, the structure of the embodiment shown in FIG. 2 will be described. As shown, the I/Q outputs of the FIG. 1 arrangement are input as signals I-in and Q-in at respective input terminals. Each signal I and Q, respectively, is supplied to a corresponding I and/or Q signal branch, respectively, where it is subjected to an analog-to digital conversion using A/D converter means 11a, 11b, respectively. These input terminals form part of an input means adapted to receive I and Q signals as first input signals which contain a plurality of channels.

Furthermore, the A/D converted I and Q signals are input to a time-to-frequency-domain-transforming means 12 (FFT) which is adapted to perform a transformation of said first input signals from time-domain into frequency-domain. The transformation result at the outputs of the transforming means 12 is represented as a power spectrum of said respective first input signals (and may thus be plotted as power versus distinct frequencies contained in the first input signal for the I as well as for the Q signal and/or signal component).

The outputs of the transforming means 12 are input to a subtracting means 13 as so called second input signals (which as previously mentioned) are represented by the power spectra of said respective transformed first input signals. The subtracting means outputs a power difference spectrum at its output which represents the frequency dependent gain difference between the different receiver branches.

Figure 3A:
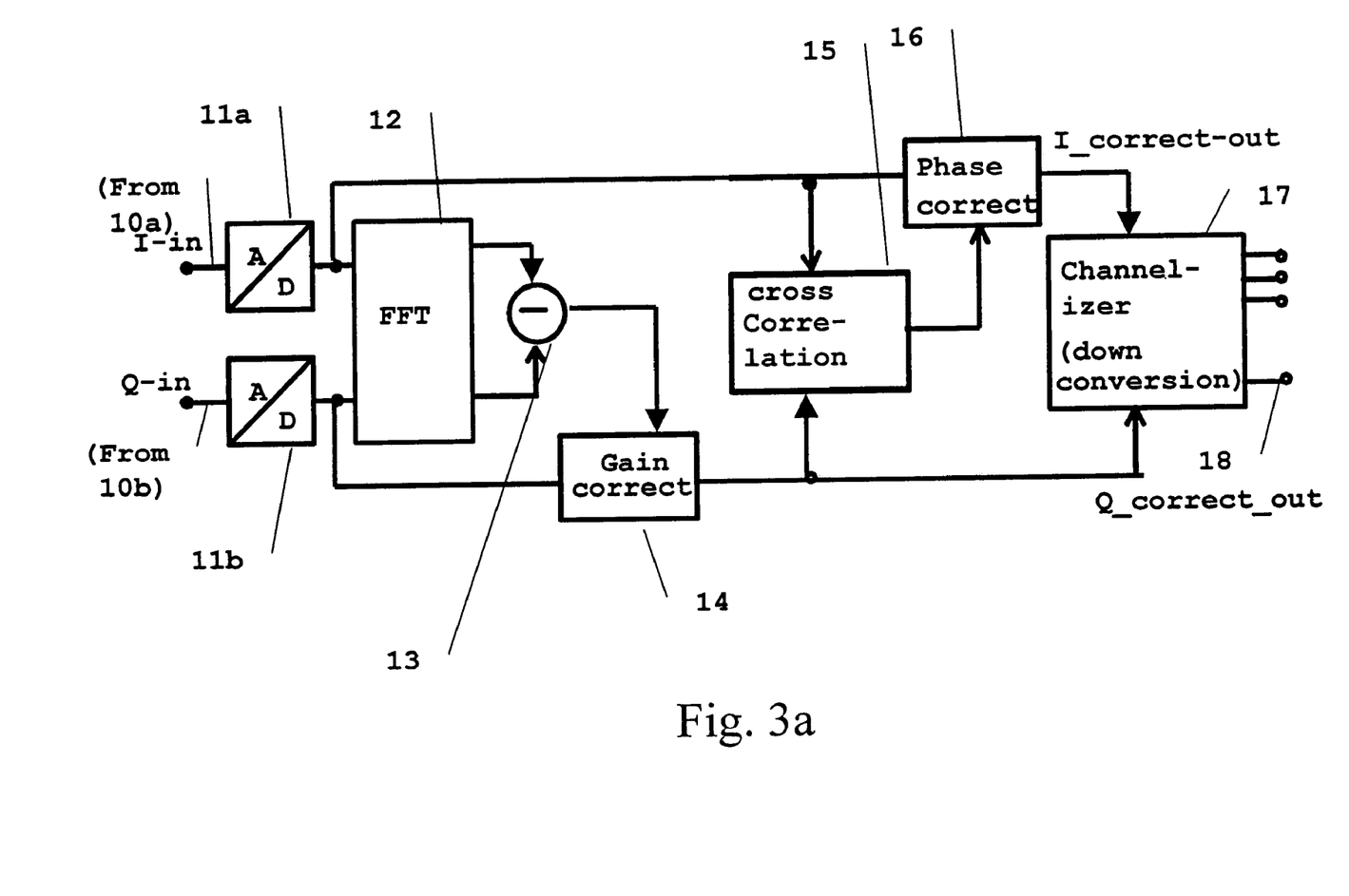
FIGS. 3a through 3d show modifications of the embodiment illustrated in FIG. 2.
Figure 3B:
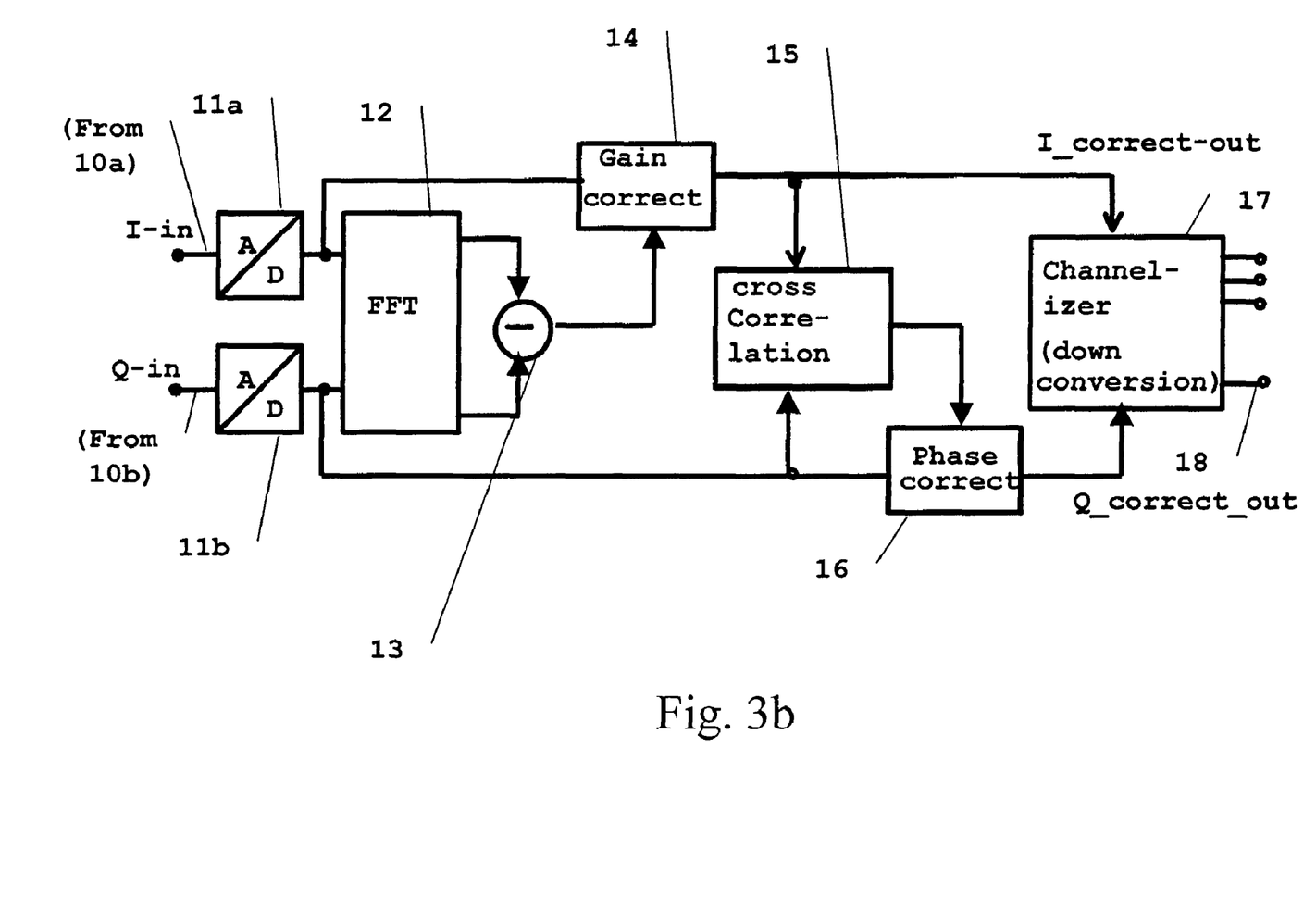
Figure 3C:
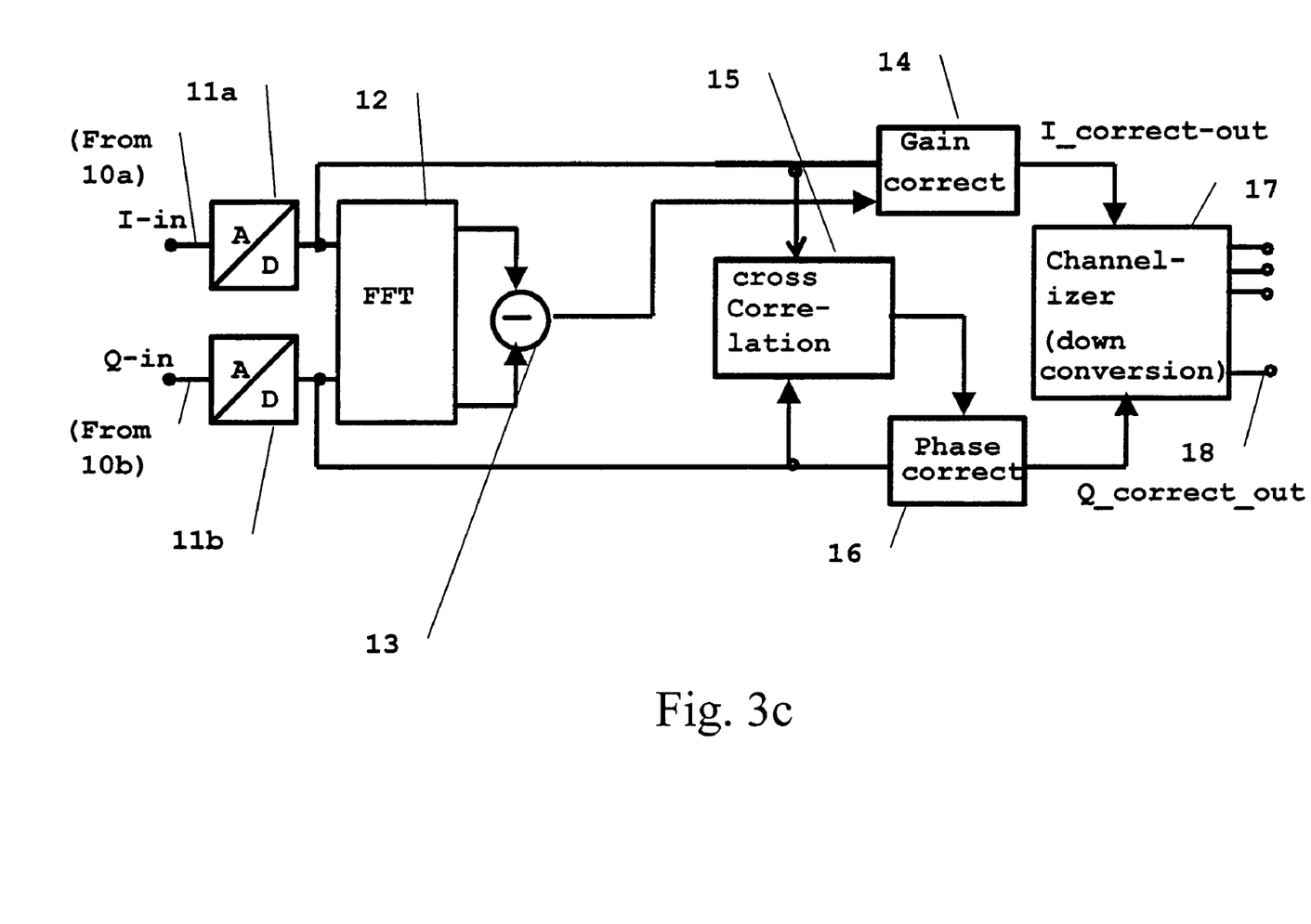
Figure 3D:
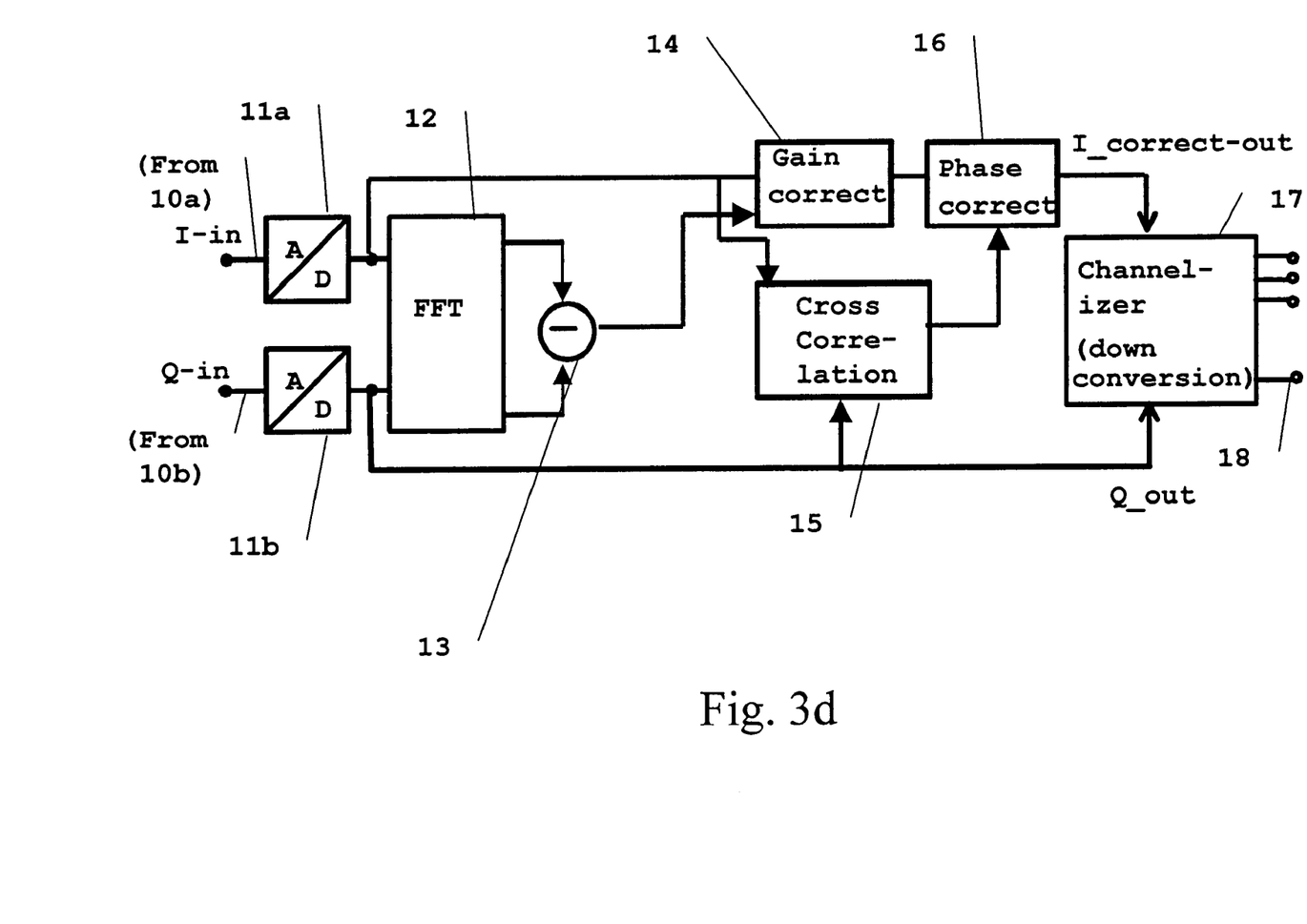

Note that the subtracting means comprises a magnitude detector if a so-called Complex FFT is applied. A complex FFT requires slightly more processing power but allows a more precise phase error estimation. Use of a complex FFT is illustrated in outline in FIGS. 4 to 6. Basically, the "plain" Fast Fourier Transformation FFT as illustrated in FIGS. 2 to 3*d* delivers the power spectrum (as mentioned before). The Complex FFT means that magnitude and phase are calculated, so that by the additional magnitude functional block only the magnitude of the values is used and the phase is omitted (typical function of e.g. digital signal processors DSPs). The decision whether FFT or complex FFT is used is dependent on the complexity one can afford and the precision one desires. In principle, also in FIGS. 2 to 3*d* complex FFT can be used, whereas in FIGS. 4 to 6 also "plain" FFT can be used. Furthermore it is to be noted that instead of FFT also DFT (Discrete Fourier Transformation), whether "plain" or "complex" can be used, similar to the usage of FFT, though usage of DFT is not shown in the Figures.

Moreover, the imbalance correction device contains a cross-correlation means 15 arranged to receive at its inputs third input signals based on said first input signals. (Note that the third input signals may be the first input signals as such and/or a signal based on a/the first input signals which has/have been processed, e.g. by gain correction and/or power adjustment etc. as will be explained later). The cross correlation means 15 outputs a cross-correlation of said third input signals. The cross-correlation output is proportional to a phase error between said respective third input signals, i.e. represents a phase error between the I and Q signals in the respective signal branch. Note that in general, the cross correlation is a measure for the correlation between two independent signals. That is, it determines how related two signals are. Orthogonal signals are unrelated (uncorrelated), thus, their cross correlation result would be zero.

The output of the subtracting means 13 is supplied to a gain correction means 14 arranged in one of said respective signal branches and receiving at its input a fourth input signal based on said associated first input signal, wherein a gain of said fourth input signal is corrected based on said power difference spectrum such that said gain of said fourth input signal equals the gain of the other one of said first input signals. (Note that in the arrangement shown in FIG. 2, here the first and fourth input signals equal each other in the I signal branch.)

Also, a phase correction means 16 arranged in one of said respective signal paths is provided, which receives at its input a fifth input signal based on said associated first input signal, wherein a phase of said fifth input signal is corrected based on said cross-correlation output, such that said phase of said fifth input signal is in quadrature relation to the other one of said first input signals.

"Quadrature relation" here means that the signals (I and Q components) are to a degree which is defined by configuration of the device in quadrature to each other. In a preferred and perfect case this means exactly 90° phase shift. However, in practical implementations, the quadrature relation obtained by correction may deviate from the perfect case. The degree of deviation that may still be acceptable and that may be reached depends on the resolution of e.g. delay elements used in phase correction and/or of the resolution of detection of phase imbalance. (Note that typical RF I/Q-converters exhibit phase errors of around 2-5 degrees.) The required and/or desired accuracy for the mult-carrier application is in the order of about 0.01 degrees, which is considered to be close to "perfect" quadrature. Thus, quadrature relation here means that the phase imbalance is in the order of about 0.01 degrees or less.

(Note that in the arrangement shown in FIG. 2, here the third and fifth input signals equal each other in the I signal branch, while the first and third input signals equal each other in the Q signal branch.)

Note that the input signals to respective branches of the imbalance (also referred to as error) correction device have been assigned numbers for convenience in order to explain subsequent modifications of the device arrangement.

As outlined above, FIG. 2 shows a case in which in one of said signal branches, i.e. Q, said first input signal equals the third input signal, while in the other of said signal branches, i.e. I, said first input signal equals the fourth input signal, the third input signal equals the fifth input signal, with the third and the fifth input signals being equal to the gain-corrected fourth input signal (i.e. the output signal of the gain correction means).

According to a modification of the arrangement as shown in FIG. 3*d*, in one of said signal branches, i.e. Q, said first input signal equals the third input signal, while in the other of said signal branches, i.e. I, said first input signal equals the third and the fourth input signal, and the fifth input signal equals the gain-corrected fourth input signal.

Additionally, in a still further modification (not shown in a figure), in one of said signal branches, i.e. Q, said first input signal equals the third input signal, while in the other of said signal branches, i.e. I, said first input signal equals the third and the fifth input signal, and the fourth input signal equals the phase-corrected fifth input signal. This corresponds to an arrangement similar to FIG. 3*d* with the exception that the sequence of means 14 and 16 is interchanged.

Heretofore, embodiments and modification were described, in which said gain correction means 14 and said phase correction means 16 are arranged in the same respective signal branch. The branch I for the in phase component was chosen as an example. Nevertheless, the means 14 and 16 can also both be arranged in the quadrature component branch Q.

Additionally, said gain correction means 14 and said phase correction means 16 can be arranged in respective different ones of said signal branches. Examples for such arrangements are illustrated in FIGS. 3*a* to 3*c*. Note that according to a modification (not shown) of FIG. 3*c*, the gain correction means 14 and the phase correction means 16 can also be interchanged so that gain correction could be performed on the Q signal component while phase correction could be performed on the I signal component.

In any arrangement, said phase correction means 16 comprises controllable delay elements by means of which the phase can be corrected. Likewise, said gain correction means 14 comprises controllable amplifier elements by means of which the gain and/or power can be corrected.

Figure 4:
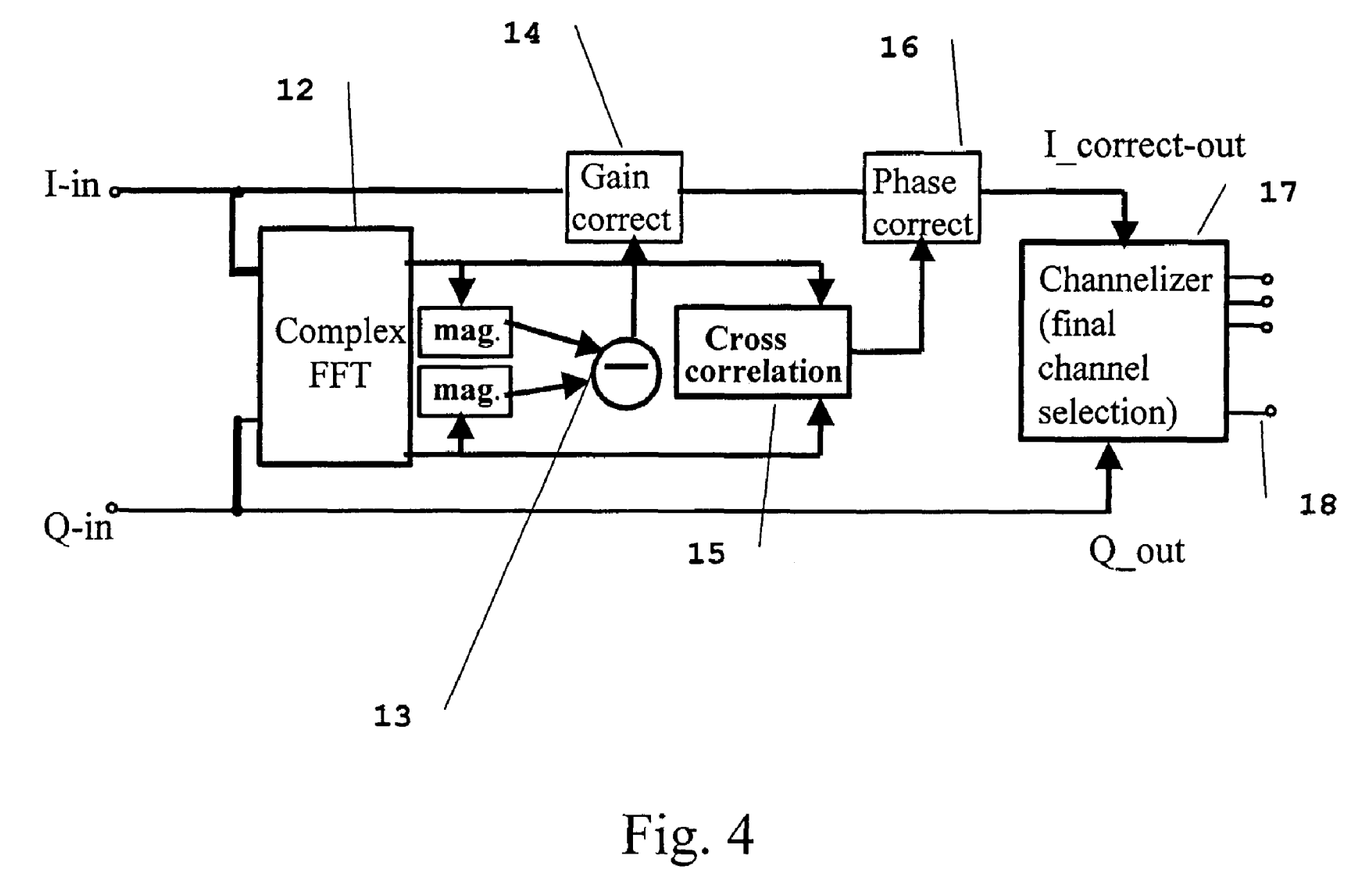
FIG. 4 shows a further embodiment of the imbalance correction device.

In a further embodiment of the imbalance correction device shown in FIG. 4, where a complex FFT is performed also the cross correlation means receives as its input the output of the time-to-frequency-domain conversion means. Stated in other words, in the arrangement shown in FIG. 4, the third input signals equal the second input signals, while the remaining structure is identical to the one shown in FIG. 2.

The embodiments described so far in connection with FIGS. 2 to 4 showed an arrangement in which gain/phase correction is performed on the (input) signal in the time domain.

Figure 5:
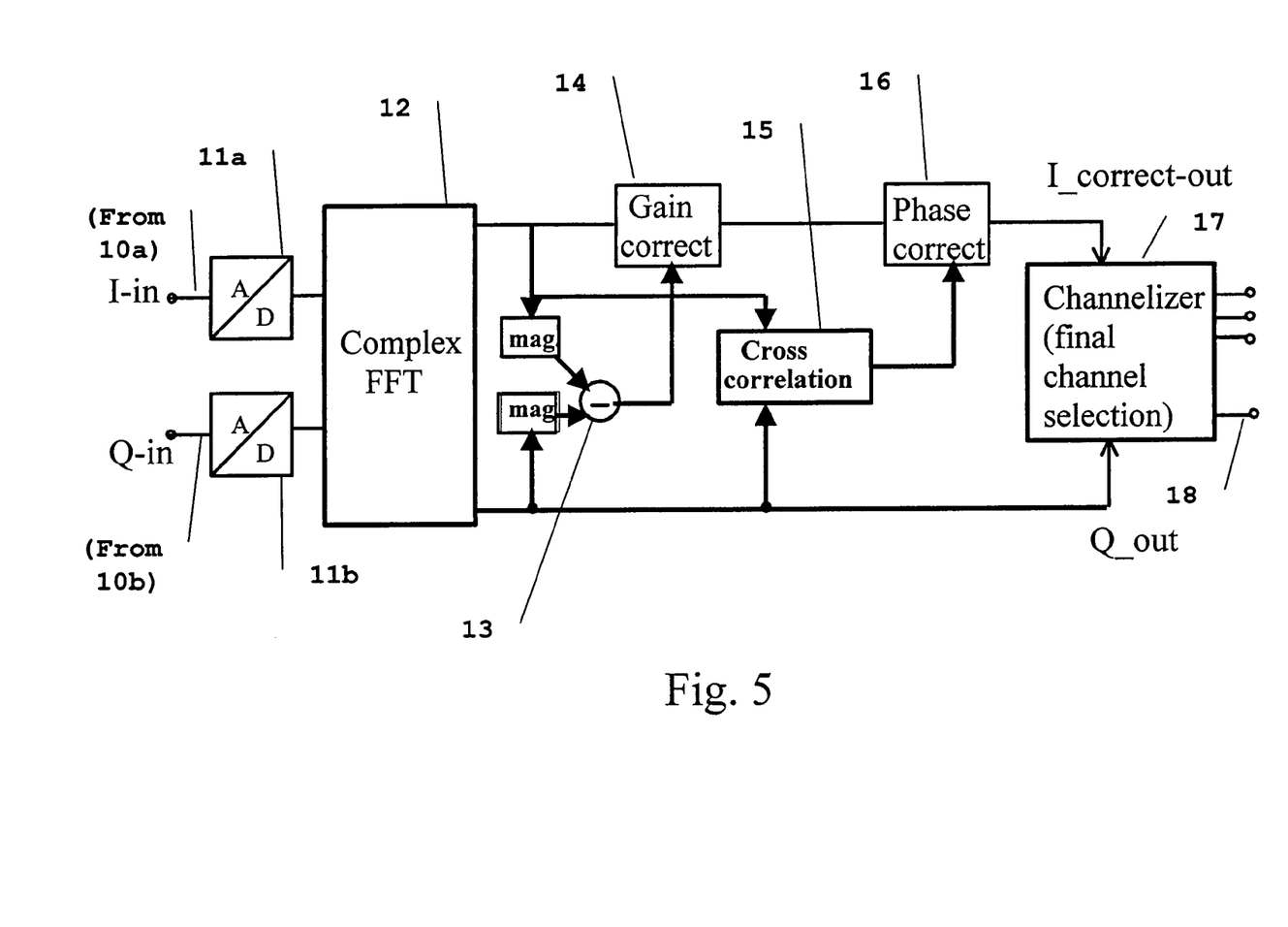
FIG. 5 shows a still further embodiment of the imbalance correction device.
Figure 6:
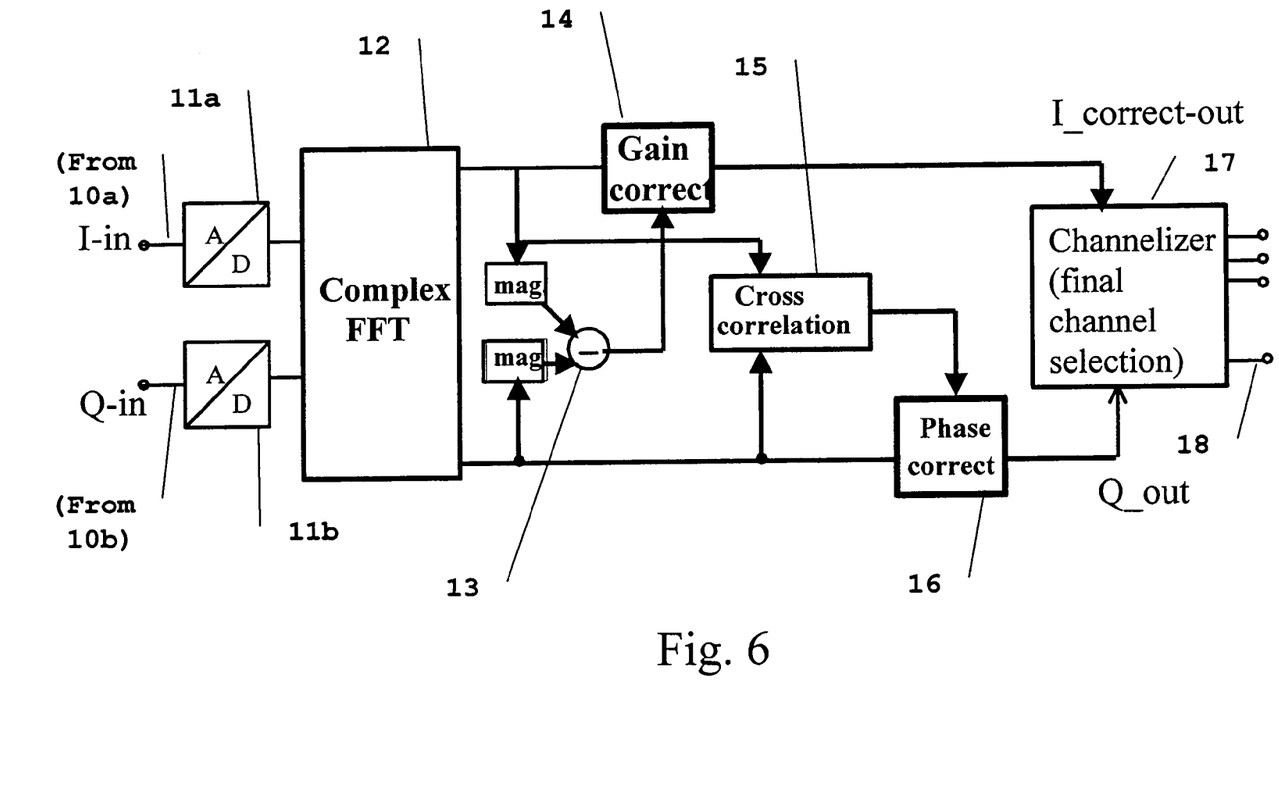
FIG. 6 shows another further embodiment of the imbalance correction device.

FIGS. 5 and 6 show two examples of further embodiments including complex FFT, which adopt a structure in which gain and phase correction are performed in the frequency domain. That is, upon time-to-frequency-domain conversion, the outputs (I/Q branches and/or paths) of the conversion means are subjected to gain/phase correction.

For example, in FIG. 5 and considering the I branch in frequency domain, the second, third and fourth input signals are identical, while the Q branch in frequency domain, the second and third input signals are identical. The fifth input signal is the output signal of the gain corrected fourth input signal.

FIG. 6 shows a variation of FIG. 5 according to which gain/phase correction are performed in different branches, i.e. one of them in the I branch, the other in the Q branch. Further modifications similar to those shown in connection with FIGS. 3*a* to 3*d* are conceivable.

Thus, I and Q components are associated to a respective signal branch. In this connection it should however be noted that each signal branch has a time domain representation as well as frequency domain representation after FFT processing (apart from FFT, Discrete Fourier Transformation DFT may also be applied). The gain/phase imbalance correction means can thus be arranged in the time domain signal branch or in the frequency domain signal branch.

As regards the differences between "plain" FFT as illustrated in FIGS. 2 to 3*d* and complex FFT shown in FIGS. 4 to 6, reference is made to the explanations as given further above.

The outputs of the error correction means are supplied to a channelizer means 17 arranged to receive at its respective inputs the phase-corrected and gain-corrected signals based on said first input signals associated to said respective signal branches and adapted to demodulate said signals into the respective individual channels, which are output at terminals 18.

Heretofore, the present invention has mostly been described in terms of different functional blocks, they could be implemented as dedicated hardware or software algorithms. For example, the present invention in their functional behavior could be realized as a hardware component for example by a Digital Signal Processor DSP unit, an ASIC (Application Specific Integrated Circuit), or FPGA (Field-Programmable Gate Array).

Subsequently, the description will focus on the functional behavior of the error correction device according to the present invention.

The analog outputs from the I/Q converter (FIG. 1) are digitized by the A/D-converters 11*a*, 11*b*. At this point, both I- and Q-branch signal components contain the same signal composed from the frequencies above and below the carrier frequency. Upper and lower sidebands are derived (by adding or subtracting the I/Q-signals with proper phase (+/−90 deg) in a channelizer. In the ideal case of perfectly matched branches, upper and lower channels are completely separated.

The input RF signals can be described by the equations:

$$V_{RF} = \sum_{i=1...N} A_i(t) \cos(\omega_i t + \Theta_i(t)) \quad (1)$$

$$V_{LO\_I} = \cos(\omega_0 t) \quad (2a)$$

$$V_{LO\_Q} = \sin(\omega_0 t) \quad (2b)$$

With $V_{RF}$ representing the signals of the various channels at the frequencies $\omega_i$ contained in the RF signal (FIG. 1). And $V_{LO\_I}$ and $V_{LO\_Q}$ representing the respective local oscillator signals used for mixing with the (power splitted) input signals.

After the frequency conversion the signals at the I- and Q-branches are:

$$V_I = V_{RF} \cos(\omega_0 t) \quad (3a)$$

$$V_Q = V_{RF} \sin(\omega_0 t) \quad (3b)$$

Substituting equation (1) in equation (3a) and (3b), respectively, and applying some trigonometric addition theorems yields:

$$V_I = 1/2 \sum_{i=1...N} A_i(t) \cos((\omega_i - \omega_0)t + \Theta_i(t)) \quad (4)$$

$$V_Q = 1/2 \sum_{i=1...N} (1 - \varepsilon_i) A_i(t) \sin((\omega_i - \omega_0)t + \Theta_i(t) - \varphi_i)$$

With $\varepsilon$ representing the amplitude difference and $\phi$ representing the phase difference between the I- and Q-branches. Note that the summing terms $\cos(\omega_i + \omega_0)t$ are omitted as these are suppressed by the low pass filters (anti-alias filters) 7*a*,7*b*, 9*a*,9*b*.

Because of these phase and amplitude errors (or imbalance), signals from either side of the local oscillator frequency are now overlapping, causing significant interference within the wanted channel. That is, channels contained in the RF band interfere with other.

This invention aims to correct such an I/Q-imbalance in terms of phase and/or amplitude before the final channel selection takes place in the channelizer means.

Amplitude Error Correction

For amplitude error correction, firstly a Fourier analysis (FFT, Fast Fourier Transformation, or DFT, Discrete Fourier Transformation, or "complex" Fast Fourier or "complex" Discrete Fourier Transformation) is performed on each signal branch I, Q to transform the time-domain signals $V_I$ and $V_Q$ into the frequency-domain. The result of the Fourier analysis as e.g. FFT represents the power spectrum in each of the branches. The principle FFT algorithm is known per se. Based on the two obtained power spectra, i.e. one for I branch, one for Q branch, the power difference at each frequency point is obtained as a direct measure for the amplitude error $\varepsilon$ by subtracting the power spectra from each other. Based on the obtained power difference the required equalizer coefficients are derived to correct for the frequency dependent I/Q-gain difference in either the I- or Q-branch. Alternatively, each branch could be corrected by e.g. half the amplitude error amount, one path being attenuated while the other being amplified, so that in result the amplitude of I and Q branch signals is equalized. Note that a Fourier spectrum transformation (e.g. FFT or DFT) is performed on each path by means of digital signal processing. The resulting frequency dependent power spectra of both branches are identical, as the phase shift of the down conversion disappears in the power spectrum. Any difference between I and Q represents the amplitude error/imbalance at each frequency point, which can now be corrected within the accuracy of the A/D-converter resolution and DSP processing power by means of an equalizer. As the original input spectrum is used for this operation, no test signal is needed; the correction can be done if required for every single sample or at selected frequency points only (corresponding already to a respective channel). Though the Fourier Transformation such as FFT requires a huge amount of processing power, the overall increase in processing power is less significant, as the Fourier Transformation such as FFT basically performs the channelization.

Phase Error Correction

The phase error has two independent origins:

phase shifter error of the local oscillator LO frequency different phase delay of the I/Q paths.

The phase shifter error of the local oscillator has typically the largest contribution, as the lowpass filters are broadband for the multi-carrier receiver. The phase shifter error introduces a frequency independent phase error. Depending on the requirements, a frequency independent phase correction might be sufficient and be done as follows:

The cross correlation of the I/Q-signals is obtained. The result is proportional to the phase error φ and the total signal power. The correlator output may be normalized to the signal power to receive an error signal proportional to the phase error for a direct correction. Alternatively it is used in a feed-back loop to minimize the phase error in a kind of iteration process, which basically is as follows: calculate the cross correlation function, if not zero, delay one branch and calculate again. Repeat this until zero (i.e. perfect quadrature relation) or a until a preconfigured and/or selectable/programmable minimum, i.e. sufficient quadrature relation is obtained.

Interpolating (or oversampling) either the I- or Q-signal component (depending on in which branch phase correction is applied) is performed in order to achieve the required phase resolution and then the corresponding signal is delayed in order that the cross correlation signal becomes zero or at least minimum. In case of a feedback loop arrangement, this process is conducted until the cross correlation result equals zero (or has fallen below a predetermined threshold).

Again, the cross correlation function of the I- and Q-signal components is calculated with the help of digital signal processing. Although both channels contain originally the same spectrum, the I- and Q-signals are not correlated in the ideal case of perfect 90-degree phase shift. The result of the cross-correlation is applied to correct for the phase error between the I- and Q-signal components.

If the cross correlation result does not fall below the certain threshold, the frequency dependent phase error has to be corrected additionally, either after the subsequently explained demodulation or by applying a complex FFT and the structure as outlined in FIGS. 4-6.

Namely, for demodulation, the I- and Q-signal components are demodulated in a digital I/Q conversion (channelizer 17) and the adjacent channels are suppressed with lowpass filters. This second, digital, frequency conversion can be considered ideal, but the original phase error from the analog process remains.

Thus, as has been described above, the receiver according to the present invention basically contains the following stages:

A multi-branch receiver with two or more branches converting an RF band including different phase shifts and comprising plural channels (frequencies) into a low-pass limited baseband signal containing at least one, but generally multiple channels, a Fourier Transformation, such as FFT, based spectrum analysis to determine the power spectra within the multiple receiver branches and a subtractor to calculate the frequency dependent correction factors for the branches, an IQ-amplitude imbalance correction stage, typically comprised of a programmable equalizer adapted to perform gain correction, a cross correlation calculation functionality adapted to calculate the phase error between the signal components of the respective paths, an interpolator and phase shifter, comprised in a phase correction means, adapted to correct the detected/measured phase error as required, summing circuits are provisioned (within the channelizer) to combine the signals of the RX branches with a proper phase to select either of the wanted side-bands.

Finally, one or multiple second, digital conversion stages (channelizers) including decimators are provided in order to demodulate the wanted channels.

Optionally, a second cross correlator per channel may be provisioned in order to determine the phase shift of each channel, and also optionally, a second phase shifter per channel may then be provisioned in order to correct the phase shift of each channel.

Also, the digital error correction device need not necessarily to be implemented like in the block diagrams and description as given above. There are many other possibilities:

For example, in case that an explicit estimation of the phase imbalance is too difficult (e.g. in terms of processing time required, accuracy achieved in one step, etc.), the phase imbalance could be minimized in some kind of feedback control loop. Phase and amplitude imbalance could be estimated jointly in the I-Q domain and corrected in a vector multiplier, maybe also using a kind of control loop structure. The frequency dependence of the amplitude imbalance is measured via a e.g. a FFT, but the correction is effected still in the time domain. It is also conceivable to perform amplitude correction inside the channelizer, i.e. in the frequency domain. Many other ways might be possible.

Also, the invention is not limited to direct conversion only, but also to single- or even multiple-conversion if followed by an analog IQ-demodulator, which is also feasible, because it is easier to produce high quality demodulators at a fixed and relatively low frequency than directly at radio frequency RF.

Even though the present invention has been described herein above with a certain focus on hardware realizations, it is of course to be understood that the present invention simultaneously addresses a corresponding method for digital imbalance correction method, which can be carried out independent of any specific hardware and which method comprises the steps of inputting first input signals I-in, Q-in containing a plurality of channels and resulting from an I/Q conversion, time-to-frequency-domain-transforming said inputted first signals to perform a transformation of said first input signals from time-domain into frequency-domain, the transformation result being represented as a power spectrum of said respective first input signals, subtracting the power spectra of said respective transformed first input signals and outputting the gain difference as a function of frequency, performing a cross-correlation based on said input signals, and outputting said cross-correlation which is proportional to a phase error between said respective correlation input signals, performing a gain correction for said input signals based on said power difference spectrum such that said gain of said input signals equals each other, and performing a phase correction for said input signals based on said cross-correlation such that said phase of said input signals is in quadrature relation to each other.

According to further details of the method
said phase correction step comprises controlling a delay,
said gain correction step comprises controlling an amplification,
said inputting step further comprise analog-to-digital conversion to covert analog input data to digital data, and
the method further comprises a channelization step which processes the phase-corrected and gain-corrected signals based on said first input signals and demodulates said signals into the respective individual channels.

Accordingly, as has been described herein above, the present invention concerns digital imbalance correction device, comprising input means adapted to receive first input signals I-in, Q-in containing a plurality of channels from an I/Q converter stage at respective input terminals, each input terminal being associated to a respective signal branch, a time-to-frequency-domain-transforming means FFT adapted to perform a transformation of said first input signals from time-domain into frequency-domain, the transformation result being represented as a power spectrum of said respective first input signals, a subtracting means arranged to receive at its inputs second input signals which are represented by the power spectra of said respective transformed first input signals and to output the gain difference as a function of frequency at its output, a cross-correlation means arranged to receive at its inputs third input signals based on said input signals, and to output a cross-correlation of said third input signals, said cross-correlation output being proportional to a phase error between said respective correlation input signals, a gain correction means arranged in one of said respective signal branches and receiving at its input a fourth input signal based said associated first input signal, wherein a gain of said fourth input signal is corrected based on said power difference spectrum such that said gain of said fourth input signal equals the gain of the other one of said first input signals, and a phase correction means arranged in one of said respective signal branches and receiving at its input a fifth input signal based said associated first input signal, wherein a phase of said fifth input signal is corrected based on said cross-correlation output, such that said phase of said fifth input signal is in quadrature relation to the other one of said first input signals. The present invention also concerns a corresponding method.

While the invention has been described with reference to preferred embodiments, the description is illustrative of the invention and is not to be construed as limiting the invention. Various modifications and applications may occur to those skilled in the art without departing from the true spirit and scope of the invention as defined by the appended claims.

The invention claimed is:

1. A digital imbalance correction device, comprising:
an input unit configured to receive first input signals containing a plurality of channels from an I/Q converter stage at respective input terminals, each input terminal being associated to a respective signal branch;
a time-to-frequency-domain-transformer configured to perform a transformation of said first input signals from time-domain into frequency-domain, the transformation result being represented as a power spectrum of said respective first input signals;
a subtracting unit configured to receive at its inputs second input signals which are represented by the power spectra of said respective transformed first input signals and to output a gain difference as a function of frequency at its output;
a cross-correlator configured to receive at its inputs third input signals based on said first input signals, and to output a cross-correlation of said third input signals, said cross-correlation output being proportional to a phase error between said respective correlation input signals;
a gain corrector arranged in one of said respective signal branches and configured to receive at its input a fourth input signal based on said associated first input signal, wherein a gain of said fourth input signal is corrected based on said power difference spectrum such that said gain of said fourth input signal equals the gain of the other one of said first input signals; and
a phase corrector arranged in one of said respective signal branch and configured to receive at its input a fifth input signal based on said associated first input signal, wherein a phase of said fifth input signal is corrected based on said cross-correlation output, such that said phase of said fifth input signal is in quadrature relation to the other one of said first input signals.

2. A device according to claim 1, wherein
said phase corrector comprises controllable delay elements.

3. A device according to claim 1, wherein
said gain corrector comprises controllable amplifier element.

4. A device according to claim 1, wherein
said input unit further comprises an analog-to-digital converter unit configured to convert analog input data to digital data.

5. A device according to claim 1, further comprising
a channelizer unit configured to receive at its respective inputs the phase-corrected and gain-corrected signals based on said first input signals associated to said respective signal paths and adapted to demodulate said signals into the respective individual channels.

6. A device according to claim 1, wherein
in one of said signal branch said first input signal equals the third input signal, while
in the other of said signal branch said first input signal equals the fourth input signal,the third input signal equals the fifth input signal, with the third and the fifth input signals being equal to the gain-corrected fourth input signal.

7. A device according to claim 1, wherein
in one of said signal branch said first input signal equals the third input signal, while
in the other of said signal branch said first input signal equals the third and the fourth input signal, and the fifth input signal equals the gain-corrected fourth input signal.

8. A device according to claim 1 ,wherein
in one of said signal branches said first input signal equals the third input signal, while in the other of said signal branches said first input signal equals the third and the fifth input signal, and the fourth input signal equals the phase-corrected fifth input signal.

9. A device according to claim 1, wherein
said gain corrector and said phase correction unit are arranged in the same respective signal branch.

10. A device according to claim 1, wherein
said gain corrector and said phase correction unit are arranged in respective different ones of said signal branches.

11. A digital imbalance correction method, comprising:
inputting first input signals comprising a plurality of channels and resulting from an I/Q conversion;
time-to-frequency-domain-transforming said inputted first signals to perform a transformation of said first input signals from time-domain into frequency-domain, the transformation result being represented as a power spectrum of said respective first input signals;
subtracting the power spectra of said respective transformed first input signals and outputting a gain difference as a function of frequency;
performing a cross-correlation based on said first input signals, and outputting said cross-correlation which is proportional to a phase error between said respective correlation input signals;
performing a gain correction for said first input signals based on said power difference spectrum such that said gain of said first input signals equals each other; and
performing a phase correction for said first input signals based on said cross-correlation such that said phase of said first input signals is in quadrature relation to each other.

12. A method according to claim 11, wherein
said phase correction comprises controlling a delay.

13. A method according to claim 11, wherein
said gain correction comprises controlling an amplification.

14. A method according to claim 11, wherein
said inputting further comprises analog-to-digital conversion to covert analog input data to digital data.

15. A method according to claim 11, further comprising:
performing a channelization which processes the phase-corrected and gain-corrected signals based on said first input signals and demodulates said signals into the respective individual channels.

16. A digital imbalance correction device, comprising:
an input unit configured to receive first input signals;
a time-to-frequency-domain-transformer configured to perform a transformation of the first input signals from a time-domain into a frequency-domain and to output power spectra of the transformed first input signals;
a subtractor configured to receive second input signals, which are based on the power spectra, and to output a gain difference of the second input signals as a function of frequency;
a cross-correlator configured to receive third input signals, which are based on the first input signals, and to output a cross-correlation of the third input signals, wherein the cross-correlation output is proportional to a phase error between the third input signals;
a gain corrector configured to receive a fourth input signal, which is based on at least one of the first input signals, and to correct a gain of the fourth input signal using a difference of the power spectra so that the gain of the fourth input signal equals the gain of the other first input signals; and
a phase corrector configured to receive a fifth input signal, which is based on the at least one of the first input signals, and to correct a phase of the fifth input signal using the cross-correlation output so that the phase of the fifth input signal is in a quadrature relation to the other first input signals.

17. A device according to claim 16, wherein the first input signals comprise a plurality of channels from an I/Q converter stage at respective input terminals.

18. A device according to claim 16, wherein the phase corrector comprises controllable delay elements.

19. A device according to claim 16, wherein the gain corrector comprises a controllable amplifier element.

20. A device according to claim 16, wherein the input unit further comprises an analog-to-digital converter configured to covert analog input data to digital data.

21. A device according to claim 16, further comprising:
a channelizer configured to receive and to demodulate the corrected gain of the fourth input signal and the corrected phase of the fifth input signal into individual channels.

22. A device according to claim 16, wherein the input unit receives the at least one of the first input signals at a first signal branch and receives the other first input signal at a second signal branch, wherein at the first signal branch, the one of the first input signals equals one of the third input signals, and at the second signal branch, the first input signal equals the fourth input signal, the third input signal equals the fifth input signal, with the one of the third input signal and the fifth input signal being equal to the gain-corrected fourth input signal.

23. A device according to claim 16, wherein the input unit receives the at least one of the first input signals at a first signal branch and receives the other first input signal at a second signal branch, wherein at the first signal branch, the first input signal equals one of the third input signals, and at the second signal branch, the first input signal equals the third and the fourth input signals, and the fifth input signal equals the gain-corrected fourth input signal.

24. A device according to claim 16, wherein the input unit receives the at least one of the first input signals at a first signal branch and receives the other first input signal at a second signal branch, wherein at the first signal branch, the first input signal equals one of the third input signals, and at the second signal branch, the first input signal equals the one of the third input signal and the fifth input signal, and the fourth input signal equals the phase-corrected fifth input signal.

25. A device according to claim 16, wherein the gain corrector and the phase corrector are arranged in the same signal branch.

26. A device according to claim 16, wherein the gain corrector and the phase corrector are arranged in different signal branches.

27. A digital imbalance correction device, comprising
an input unit configured to receive first and second input signals;
a time-to-frequency-domain-transformer configured to perform a transformation of the first and second input signals from a time-domain into a frequency-domain and to output power spectra of the transformed first and second input signals;
a subtractor configured to receive the power spectra and to output a gain difference of the power spectra as a function of frequency;
a cross-correlator configured to receive the second input signal and to output a cross-correlation of the second input signal;
a gain corrector configured to receive the first input signal and to correct a gain of the first input signal using a difference of the power spectra so that the gain of the first input signal equals the gain of the second input signal, wherein the cross-correlation output is proportional to a phase error between the second input signal and the corrected first input signal or between the first input signal and the second input signal; and a phase corrector configured to receive the corrected first input signal, and to correct a phase of the corrected first input signal using the cross-correlation output so that the phase of the corrected first input signal is in a quadrature relation to the second input signal.

28. A digital imbalance correction device, comprising:

input means for receiving first input signals containing a plurality of channels from an I/Q converter stage at respective input terminals, each input terminal being associated to a respective signal branch;

time-to-frequency-domain-transforming means for performing a transformation of said first input signals from time-domain into frequency-domain, the transformation result being represented as a power spectrum of said respective first input signals;

subtracting means for receiving at its inputs second input signals which are represented by the power spectra of said respective transformed first input signals and to output a gain difference as a function of frequency at its output;

cross-correlation means fQr receiving at its inputs third input signals based on said first input signals, and to output a cross-correlation of said third input signals, said cross-correlation output being proportional to a phase error between said respective correlation input signals;

gain correction means arranged in one of said respective signal branches and for receiving at its input a fourth input signal based on said associated first input signal, wherein a gain of said fourth input signal is corrected based on said power difference spectrum such that said gain of said fourth input signal equals the gain of the other one of said first input signals; and phase correction means arranged in one of said respective signal branch and for receiving at its input a fifth input signal based on said associated first input signal, wherein a phase of said fifth input signal is corrected based on said cross-correlation output, such that said phase of said fifth input signal is in quadrature relation to the other one of said first input signals.

* * * * *